United States Patent
Park et al.

(10) Patent No.: US 7,084,020 B2
(45) Date of Patent: Aug. 1, 2006

(54) MANUFACTURING METHOD OF A THIN-FILM SEMICONDUCTOR DEVICE

(75) Inventors: Seong-Kee Park, Higashimurayama (JP); Shinya Yamaguchi, Mitaka (JP); Mutsuko Hatano, Kokubunji (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/004,858

(22) Filed: Dec. 7, 2004

(65) Prior Publication Data

US 2005/0095822 A1    May 5, 2005

Related U.S. Application Data

(62) Division of application No. 10/372,809, filed on Feb. 26, 2003, now Pat. No. 6,847,069.

(30) Foreign Application Priority Data

Jul. 2, 2002   (JP)   ............... 2002-192852

(51) Int. Cl.
*H01L 21/00*   (2006.01)
(52) U.S. Cl. .................. 438/164; 438/149; 438/166
(58) Field of Classification Search ............. 438/149, 438/150, 164, 166, 487
See application file for complete search history.

(56) References Cited

U.S. PATENT DOCUMENTS

| 6,580,122 B1 | 6/2003 | Wristers et al. |
| 6,602,761 B1 | 8/2003 | Fukunaga |
| 6,692,999 B1 * | 2/2004 | Takei et al. ............ 438/166 |

FOREIGN PATENT DOCUMENTS

| JP | A 11 121753 | 4/1999 |
| JP | A 2000 243970 | 9/2000 |

OTHER PUBLICATIONS

Ruska, Walter E.W., Microelectronic Processing. 1987, p. 58, McGraw-Hill.
Copy of Search Report/Office Action from Foreign Patent Office, issued Oct. 19, 2005.
Sze, S. M., High-speed Semiconductor Devices, 1990, pp. 248-249, John Wiley & Sons, Inc.

* cited by examiner

*Primary Examiner*—David Nelms
*Assistant Examiner*—Quoc Hoang
(74) *Attorney, Agent, or Firm*—Antonelli, Terry, Stout and Kraus, LLP.

(57) ABSTRACT

A method of forming thin-film semiconductor device is provided in which an island region of an isolated single-crystal thin-film is formed on an entire surface or within a specific region of an insulating film by utilizing cohesion phenomena due to the surface tension of a melted semiconductor, wherein more than one active region of a thin-film transistor is formed in the island region.

7 Claims, 10 Drawing Sheets

【SEM IMAGE】

【TEM IMAGE】

(BRIGHT FIELD IMAGE)　　(DARK FIELD IMAGE)

| | V-DIRECTION | L-DIRECTION |
|---|---|---|
| CRYSTAL SURFACE ORIENTATION | ⟨100⟩ | ⟨100⟩, ⟨110⟩ |
| | ⟨110⟩ | ⟨100⟩, ⟨110⟩ ⟨111⟩ |
| | ⟨111⟩ | ⟨110⟩ |

FIG.10A
FIG.10B
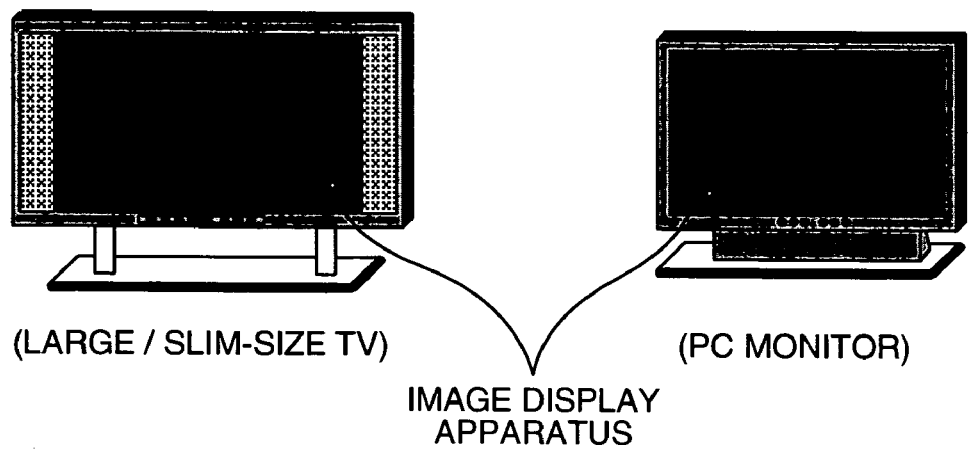
(LARGE / SLIM-SIZE TV)
(PC MONITOR)
IMAGE DISPLAY APPARATUS
FIG.10C
FIG.10D
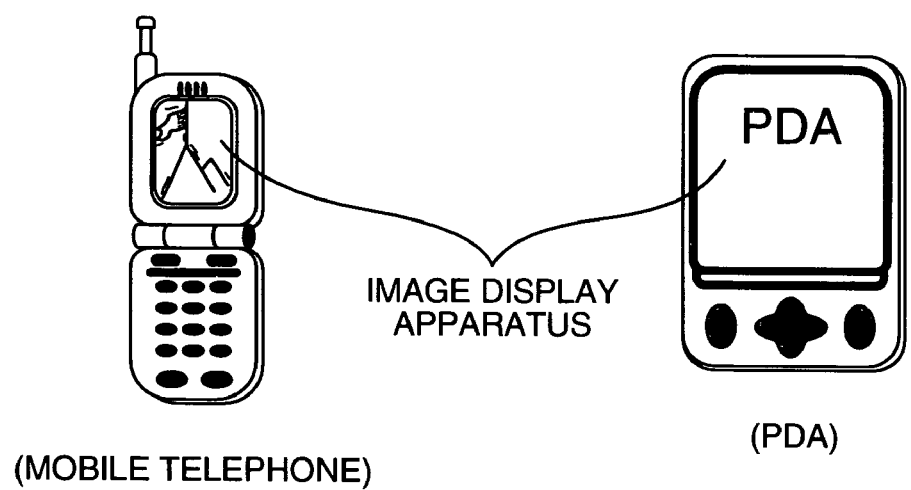
IMAGE DISPLAY APPARATUS
(MOBILE TELEPHONE)
(PDA)

MANUFACTURING METHOD OF A THIN-FILM SEMICONDUCTOR DEVICE

CROSS-REFERENCE TO RELATED APPLICATIONS

This is a Divisional application of application No. 10/372,809, filed Feb. 26, 2003 now U.S. Pat. No. 6,847,069, the entire disclosure of which is hereby incorporated by reference.

BACKGROUND OF THE INVENTION

1. Field of the Invention

The present invention relates to a thin-film semiconductor device such as a thin-film transistor (referred to as TFT hereinafter) made up of a semiconductor thin-film formed on an insulating substrate, a manufacturing method thereof, and an image display apparatus using such a device.

2. Description of the Related Art

In recent years, as the amount of information in electronic data form increases, the development of apparatus which processes and visually displays such information is becoming more and more important. With an increase in the size of image display apparatus and image sensors along with growth of the demand for higher integration density (higher precision) of pixels, the use of TFTs capable of offering high-speed drivability is required. To satisfy these requirements, it is inevitably required to develop advanced technology which makes it possible to fabricate, at low costs, TFTs made of high-quality silicon (Si) thin-films on or above a low cost electrically insulating substrate, such as a large-size glass substrate or the like.

Conventionally, methods for crystallizing an amorphous Si thin-film are known as high-quality Si thin-film fabrication technology. These methods in turn involve a laser-aided crystallization technique, which has been widely employed until recently. For example, a Si thin-film crystallized by use of an excimer laser is a polycrystalline silicon thin-film with its average grain size ranging from about 0.1 to 1.0 μm. In the case of fabrication of a TFT of the metal oxide semiconductor (MOS) type, a crystal grain boundary inevitably exists within the channel region of such a TFT. This results in a decrease in carrier mobility, which in turn leads to a degradation of performance.

Another problem faced with the approach is as follows. During fusion crystallization, a difference in cubical or volume expansion coefficients between a liquid Si and solid Si results in unwanted creation of surface convex-concave irregularity at the grain boundary, causing the TFT to decrease in withstanding or breakdown voltage. In view of these problems, a technique for enabling Si crystals to increase in grain diameter while at the same time offering surface planarization capabilities is strongly required.

As an example of a method of improving the performance of TFTs, an apparatus is disclosed, for example, JP-A-11-121753, which apparatus permits crystals to grow to have an increased length in a specified direction while letting a source/drain layout direction (equivalent to a current flow direction) become almost identical to the elongate direction of crystal grains thus grown. Additionally, in a liquid crystal display device which is disclosed for example in JP-A-2000-243970 as an embodiment, the layout directions of the sources and drains of the TFTs are arranged to almost coincide with the elongate direction of the crystal grains. Each TFT is disposed to have a longitudinal/lateral block shape (in a horizontal direction and in a vertical direction) at a display pixel array peripheral portion, when viewed from the surface side of an array substrate. However, since any one of the TFTs is such that its channel region is not single-crystallized, the performance and reliability decrease by the influence of a trap level that exists at grain boundaries. This, in turn, causes a problem that the characteristics increase in variability.

Recently, crystallization technologies have been widely used which employ solid-state lasers (such as YAG laser or the like) extremely higher in beam stability than excimer lasers. However, while rectangular single-crystal grains are formed in a laser scan direction, the average width thereof is merely from about 0.5 to 1.5 μm. Thus, it has been impossible to eliminate unwanted creation of grain boundaries within TFT active regions. To be brief, the known approaches all suffer from the presence of a plurality of grain boundaries within the active regions of the TFTs and also encounter a problem that the grain boundary number in each TFT active region can vary. As a result, the TFT characteristics are undesirably varied accordingly.

It is apparent from the technical problems stated above that in the fabrication technique for forming a high-quality polycrystalline film on a dielectric film by laser annealing methods, it remains difficult to form TFTs of high performance due to the lack of regularities of crystal grain size and face orientation, and also due to difficulties in crystal grain position control and others. Accordingly, in order to fabricate, by low-cost manufacturing methods, TFTs that are high in performance and reliability and yet low in variation, it is required to single-crystallize by relatively simple methods at least the active regions of the TFTs on an insulating substrate.

SUMMARY OF THE INVENTION

It is therefore an object of the present invention to provide a crystallization technique for enabling a semiconductor thin-film to become a single-crystalline film without fail in a region for formation of a thin-film semiconductor device such as a thin-film transistor (TFT). Another object of this invention is to provide a thin-film semiconductor device capable of simultaneously achieving, by using these methods, improvements in performance of the TFT such as electric field effect mobility and the like and also improvements in the uniformity thereof. A further object of the invention is to provide a manufacturing method of such thin-film semiconductor devices.

Through a variety of studies and experiments, the inventors have conceived a thin-film semiconductor device, such as a TFT, capable of solving the problems stated above by using physical phenomena different from traditional ones as well as a method for manufacturing such devices and also an image display apparatus using the thin-film semiconductor device of the present invention.

A first aspect of the invention lies in (1) a thin-film semiconductor device which has an insulating substrate, and an island region of an isolated single-crystal thin-film as provided on or above the insulating substrate.

(2) A further aspect is that the island region of the single-crystal thin-film has a cross-section perpendicular to the substrate, wherein the cross-section is made up of a substantially circular shape, a substantially elliptical shape or part of these shapes.

In addition, (3) the island region of the single-crystal thin-film is a stripe-shaped single-crystal thin-film, and it is possible to form more than one active region of a thin-film transistor within the island region of the single-crystal thin-film.

(4) The source/drain direction of the above-noted thin-film transistor can be disposed substantially in parallel with or substantially perpendicular to the elongate direction of the stripe-shaped single-crystal thin-film. Note here that an example of the thin-film transistor is a field effect transistor.

Additionally, (5) at least one thin-film which corresponds to the stripe-shaped single-crystal thin-film stated above can be included within the active region of the thin-film transistor.

Additionally, (6) it is possible to form at least more than one region corresponding to the active region of the thin-film transistor in the stripe-shaped single-crystal thin-film.

Additionally, (7) a main crystal orientation of the island region of the single-crystal thin-film that is provided above the insulating substrate in a vertical direction relative to the substrate may be <110>, <100>or <111>, and a crystal orientation which is in a horizontal direction with respect to the substrate and is the elongate direction of the island region of the single-crystal thin-film may be <110>, <100>or <111>.

A second aspect of the invention lies in (8) a manufacturing method of a thin-film semiconductor device, which method has: a first step of forming a semiconductor thin-film on an insulating substrate and performing patterning of the semiconductor thin-film; a second step of patterning a plurality of materials different in surface tension and disposing patterned materials at an upper part or a lower part of the semiconductor thin-film; a third step of melting the semiconductor thin-film by laser scanning and utilizing cohesion phenomena due to its surface tension to perform position control in such a way as to perform positional alignment with a patterned position to thereby form an island region of an isolated single-crystal thin-film above the insulating substrate; and a fourth step of forming more than one active region of a thin-film transistor in the island region of the isolated single-crystal thin-film.

A third aspect of the invention lies in (9) an image display apparatus which includes an image display unit, a peripheral region thereof, and a thin-film semiconductor device that is provided at least in the peripheral region of the image display unit and has an insulating substrate and an island region of an isolated single-crystal thin-film as provided above the insulating substrate, wherein the thin-film semiconductor device includes at least one circuit used to drive the image display apparatus, which circuit is selected from a group consisting of a buffer circuit, a sampling switch circuit, a precharge circuit, a shift register circuit, a decoder circuit, a clock waveform reshaping circuit, a digital-to-analog converter circuit, a power supply conversion circuit, a level shift circuit, a timing control circuit, an amplifier circuit, a memory, a processor, a gate array and a communication circuit.

Other objects, features and advantages of the invention will become apparent from the following description of the embodiments of the invention taken in conjunction with the accompanying drawings.

BRIEF DESCRIPTION OF THE DRAWINGS

FIGS. 10A to 10D are diagrams each showing electronic equipment to which the image display apparatus of the invention is applied.

DETAILED DESCRIPTION OF THE INVENTION

The present invention will be explained with reference to the accompanying drawings below. Note that although silicon (Si) is used as an example of the semiconductor material in the embodiments below for simplification purposes only, similar effects of this invention are obtainable with respect to thin-films made of all possible IV-group materials (i.e. any one of C, Si, Ge, Sn and Pb or mixed crystals of them).

Embodiment 1

An explanation will be given of a thin-film semiconductor device formed with a single-crystalline Si thin-film after crystallization of a semiconductor thin film stacked on a substrate.

Figure 1A:
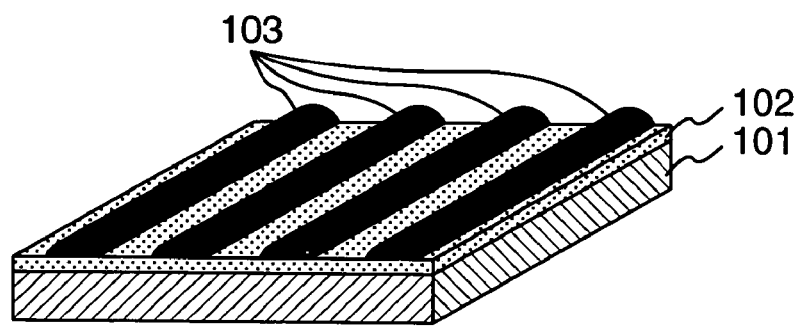
FIGS. 1A and 1B are representative drawings of the present invention and are diagrams each showing the form of a structure having a single-crystal semiconductor thin-film which is formed on an insulating substrate and a TFT as formed thereon.

FIG. 1A shows a structure in which an underlay film 102 is formed on an insulating substrate 101 on which a crystal grain 103 of single-crystalline Si is formed.

Figure 1B:
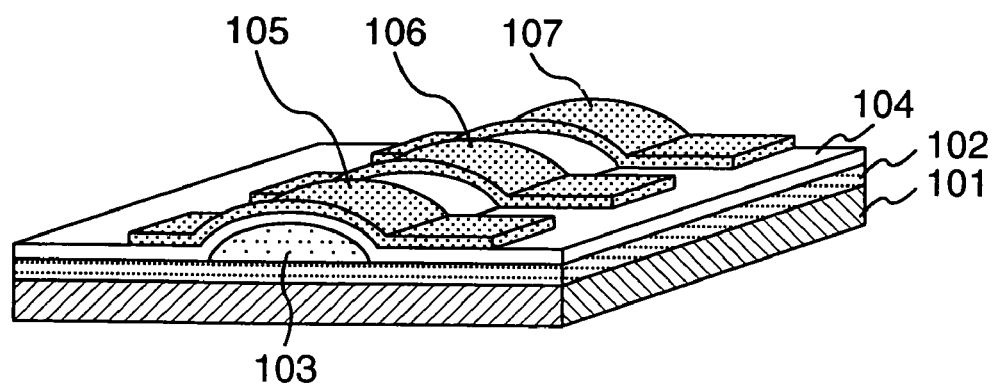

FIG. 1B shows a TFT in which an insulating film 104 is formed on the single crystal grain 103 on which a source electrode 105, a gate electrode 106 and a drain electrode 107 are formed.

Figure 2A:
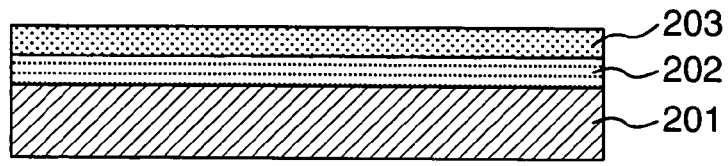
FIGS. 2A to 2D illustrate some major process steps in the fabrication of a single-crystal semiconductor thin-film on an insulating substrate.
Figure 2B:
Figure 2B:
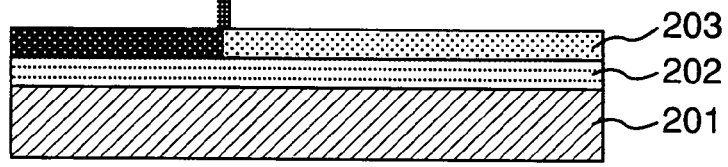
Figure 2C:
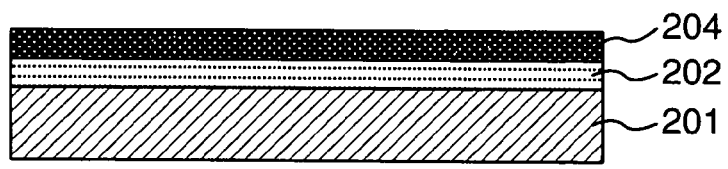
Figure 2D:
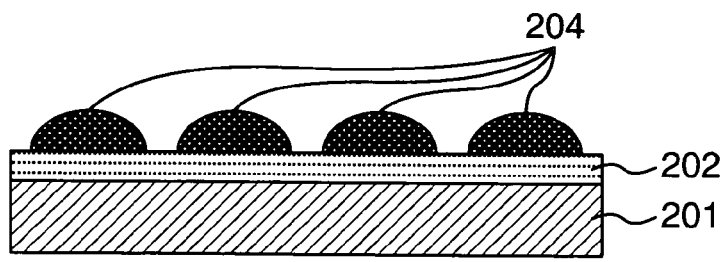

FIG. 2A is a cross-sectional diagram in accordance with this embodiment. As shown herein, on an insulating substrate 201, an underlay film 202 comprised of a Si oxide film with a thickness of about 100 nm, by way of example, and an amorphous Si thin-film 203 with its thickness of about 50 to 200 nm, or more or less, are deposited by chemical vapor deposition (CVD) methods. In this case, the thickness of such amorphous Si thin-film and that of its underlying Si oxide film should not be limited only to the values presented in this embodiment. In addition, the arrangement of the underlay film 202 may alternatively be either a Si nitride film or a laminate or "multilayered" film of a Si nitride film and a Si nitride film. Thereafter, as shown in FIGS. 2B and 2C, laser scanning is done to perform crystallization of the amorphous Si thin-film 203, thereby forming a single-crystalline Si thin-film 204. FIG. 2D depicts a cross-sectional shape of single-crystal Si thin-film 204 on the plane perpendicular to the laser scanning direction. At this time, the amorphous Si film 203 is melted or fused by laser irradiation. The result is that a plurality of stripe-shaped single-crystal film components are formed by aggregation or cohesion due to surface tension. Each single-crystal film has a cross-sectional structure which is formed of a part of a cross sectional elliptical shape or cross sectional circular shape. Although in this embodiment, the laser scanning is done in a fixed direction by using a solid-state laser, there are no specific limits as to the type of laser being used. Additionally, it is also possible to form the intended single-crystal thin-film by use of wavelength-different lasers in combination. An example of this approach is as follows. First, the Si thin-film 203 is polycrystallized by excimer laser scan techniques, and, thereafter, performed by scanning with use of a solid-state laser.

Figure 3A:
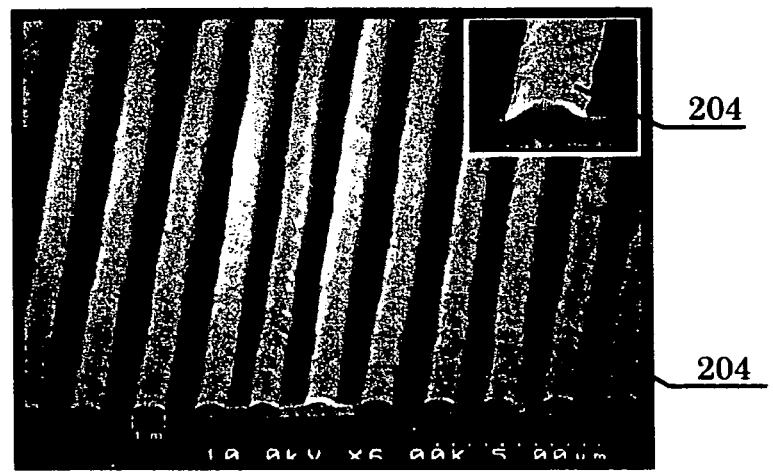
FIGS. 3A and 3B are diagrams each showing the shape and crystallinity of a single-crystal Si thin-film as formed on an insulating substrate.
Figure 3B:
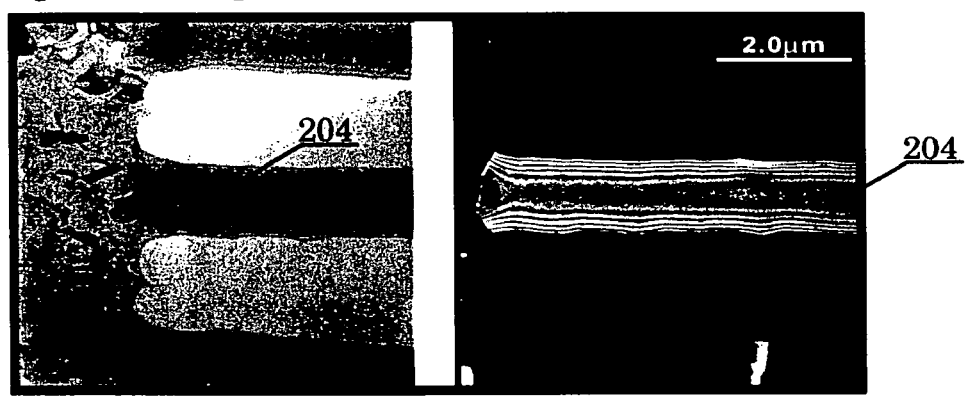

FIGS. 3A and 3B are diagrams showing the features of a single-crystal Si thin-film which was formed by this crystallization method, wherein FIG. 3A shows a picture image obtained by a scanning electron microscope (SEM), and FIG. 3B shows a bright field image (left side) of a transmission electron microscope (TEM) along with a dark field image (right side) thereof. It would be readily seen from viewing FIG. 3A that stripe-shaped single-crystal Si thin-films 204 are formed on the insulating substrate, which films extend in the same direction as the laser scan direction. As shown in an inset of FIG. 3A, these stripe-shaped single-crystal Si thin-films 204 are featured in that a cross-sectional structure on the plane perpendicular to the elongate direction resembles a part of cross sectional elliptical shape or cross sectional circular shape. This is because Si as melted by laser scanning undergoes aggregation and condensation, or cohesion, due to surface tension. In addition, crystals grow in a lateral direction by the laser scanning. This results in growth of a stripe-like single-crystal Si thin-film with a round sectional shape. Additionally, it is seen from the bright field image (left) shown in FIG. 3B that grain boundaries which would otherwise occur in conventional polycrystalline Si thin-films are no longer observed inside the crystal film. It is also seen from the dark field image (right) that each remains as a single-crystal film with no grain boundaries or no defects being contained therein. In other words, the Si thin-films as formed in this embodiment are stripe-like single-crystal Si thin-films formed on the substrate. Another feature lies in that the cross-sectional structure at the plane at right angles to the elongate direction of the crystal films has a shape of part of either a circle or an ellipse.

Embodiment 2

In this embodiment 2, an explanation will be given of an embodiment which forms a single-crystal Si thin-film at a specified location on the dielectric substrate at the crystallization process step using laser scan techniques as has been set forth in the embodiment 1. That is, in this embodiment an initial thin-film is patterned prior to crystallization for position control of the single-crystal Si thin-film, and a single-crystal Si thin-film is formed while simultaneously performing the position control by utilizing underlay films different from each other in wettability with respect to the melted Si.

Figure 4A:
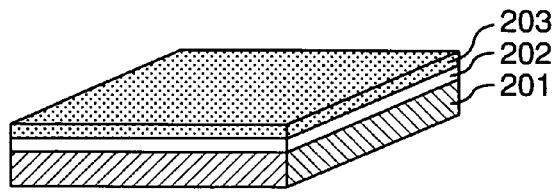
FIGS. 4A to 4G are process diagrams showing steps in the fabrication of a single-crystal semiconductor thin-film on an insulating substrate.
Figure 4B:
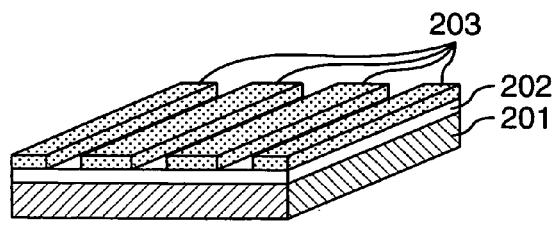

FIGS. 4A to 4G are diagrams for explanation of an embodiment which forms a single-crystal film by laser irradiation after having patterned an amorphous Si thin-film 203 into a variety of shapes. Firstly, as shown in FIG. 4A, an underlay film 202 and amorphous Si thin-film 203 are formed on a dielectric substrate 201. Then, as shown in FIG. 4B, with use of resist deposition, photomask exposure, development and etching processes, stripe-shaped regions of the amorphous Si film 203 with a width of more 5 μm or less are periodically formed on the entire surface of the insulating substrate with 10 μm intervals, and the stripe-like amorphous Si films 203 are thereafter crystallized by laser scanning. Use of this method makes it possible to periodically form the single-crystal Si thin-films having the same width and length on the overall surface area.

Figure 4C:
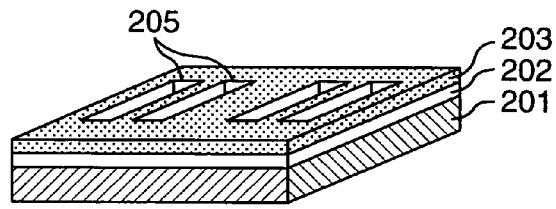
Figure 4D:
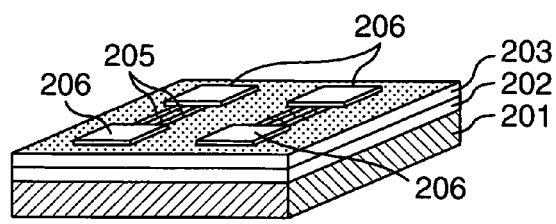
Figure 4E:
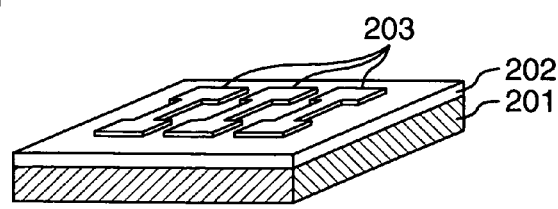
Figure 4F:
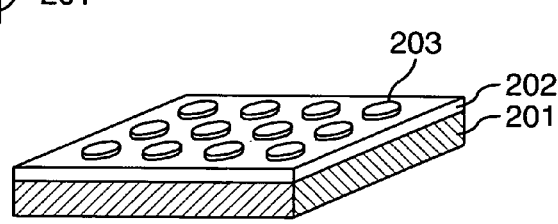
Figure 4G:
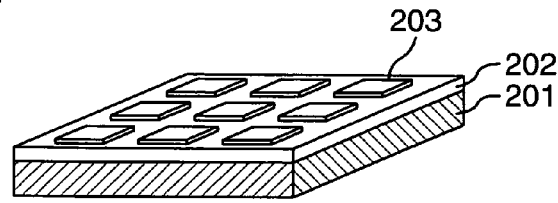

Another embodiment of the method for performing patterning of the amorphous Si thin-film 203 prior to execution of the laser scanning is as follows. As shown in FIG. 4C, rectangular openings or holes 205 are formed by partial removal of the amorphous Si film on both sides of a region to be single-crystallized. Then, as shown in FIG. 4D, thickness of the rectangular amorphous Si film 206 of the source/drain regions is made thicker than that of the channel regions. Furthermore, other rectangular holes are formed on both sides of each TFT channel region. Next, as shown in FIG. 4E, the width of the source/drain region of TFT is made larger than that of the channel region, which defines a patterning of island regions having such shape of the width. Then as shown in FIG. 4F or 4G, after completion of patterning into a prespecified shape such as a circle or a square, and the crystallization is performed, it then becomes possible to perform position control of the single-crystal films and the island regions thereof. Note here that the width, interval and length of the patterns shown in FIG. 4A to 4G may be modified in a variety of ways. Also, note that the regions to be patterned may alternatively be the entire surface area of the insulating substrate. As another alternative, the patterning may be done only at specific locations for formation of high-performance TFTs.

Figure 5A:
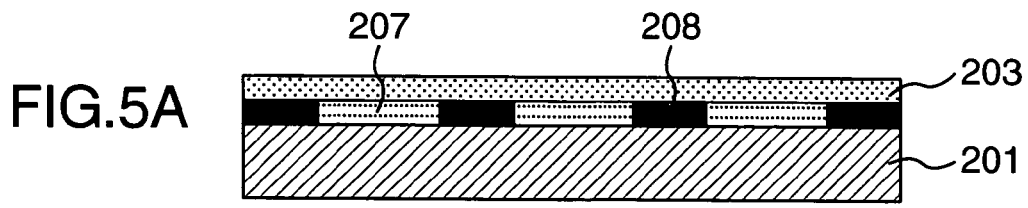
FIGS. 5A to 5E are process diagrams showing steps in the fabrication of a single-crystal semiconductor thin-film on an insulating substrate.
Figure 5B:
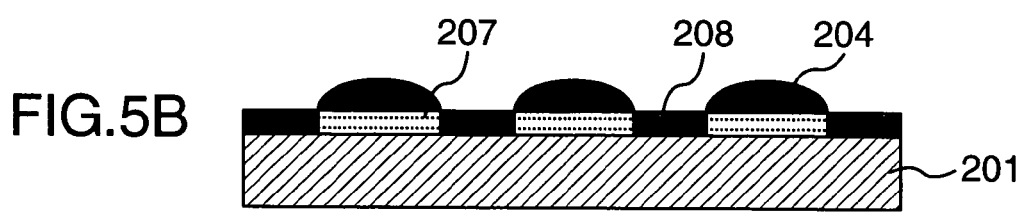
Figure 5C:
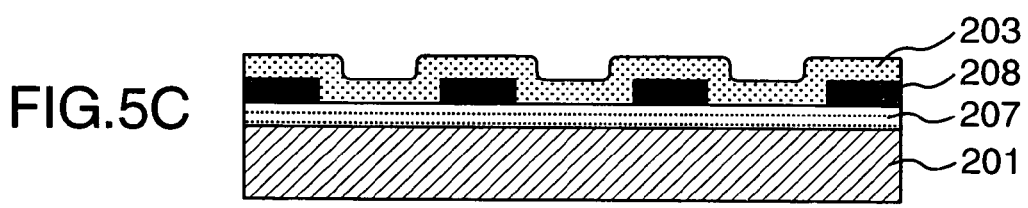
Figure 5D:
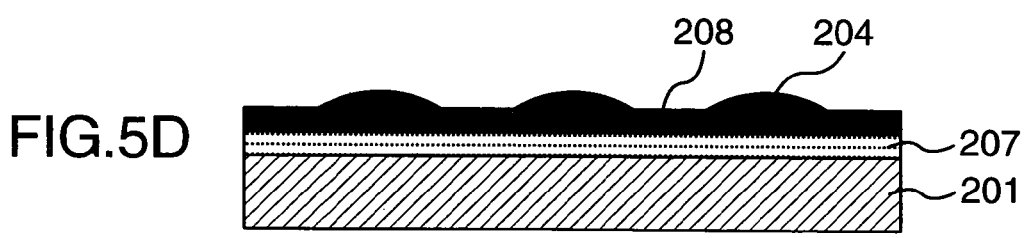
Figure 5E:
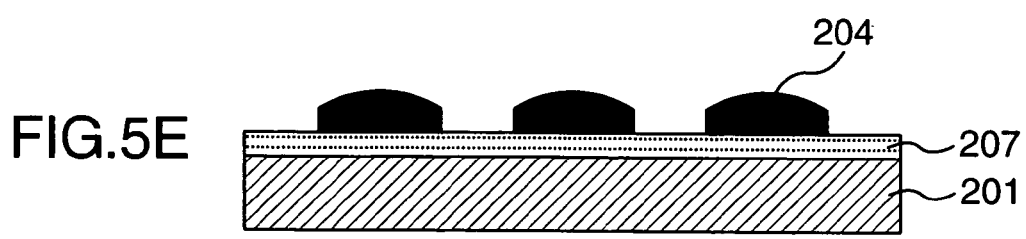

FIGS. 5A to 5E are diagrams for explanation of another embodiment which is designed to perform the position control of the island regions of a single-crystal film by utilizing films which are different in wettability relative to a melted Si as the underlay film of Si film. As shown in FIG. 5A, after having placed two kinds of films 207, 208 which are different in wettability from each other under an amorphous Si thin-film 203, a laser scanning operation is performed. By virtue of this, as shown in FIG. 5B, a melt Si is condensed and single-crystallized on the film 207 of large wettability with respect to Si. Thus, it becomes possible to control the positions of island regions 204 of single-crystal Si film. Although, in this embodiment, the wettability-different films are formed beneath the amorphous Si thin-film 203, another method is available, which is as follows. A wettability-strong film 207 may be formed beneath the amorphous Si film while letting a wettability-weak film 208 be formed on the side faces of island regions 204 of a patterned amorphous Si film. Optionally, it is also permissible to dispose wettability-different films on the amorphous Si thin-film 203. In addition, as shown in FIG. 5C, the wettability-strong film 207 is formed on an entire surface of the substrate on which an island pattern of the wettability-weak film 208 is disposed, and the amorphous Si thin-film 203 is formed on the wettability-weak film on its overall surface area. Thereafter, when crystallization by the laser scanning takes place, it is possible to form the island regions 204 of single-crystal film in such a manner that each is between adjacent ones of the wettability-weak patterns 208, as shown in FIG. 5D. A thin-film semiconductor device may be formed in the single-crystal film island regions 204. It is also permissible to form such a thin-film semiconductor device after having removed the film 208 as shown in FIG. 5E.

Figure 6A:
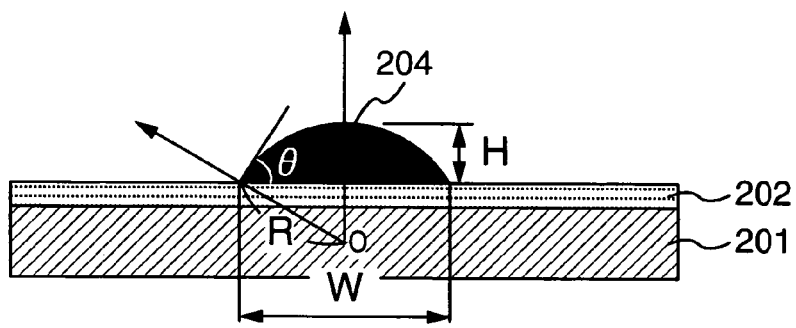
FIGS. 6A to 6D are diagrams each showing a cross-sectional view of a single-crystal semiconductor thin-film as formed on an insulating substrate.
Figure 6B:
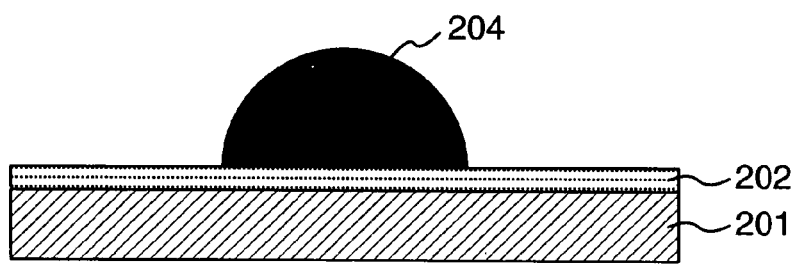
Figure 6C:
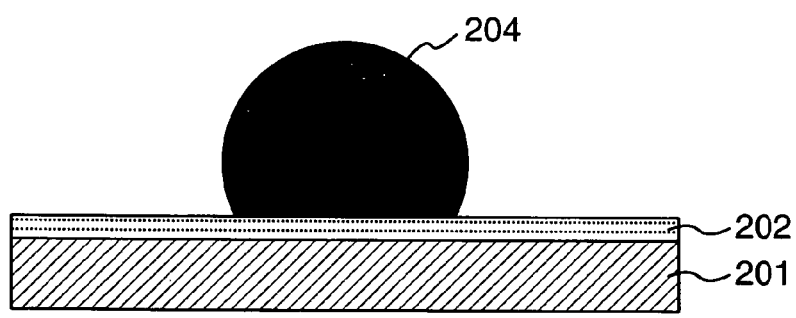
Figure 6D:
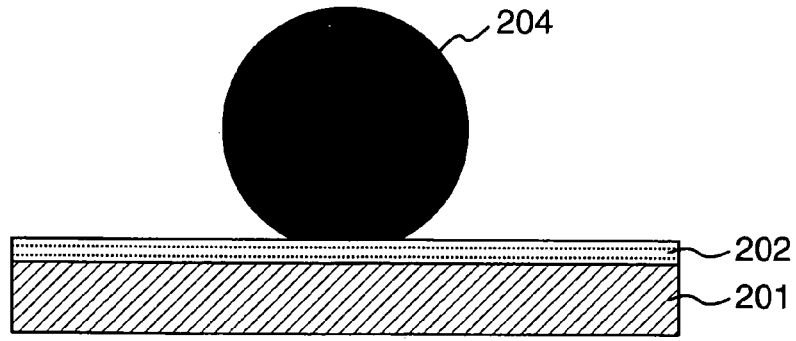

FIGS. 6A to 6D are diagrams each showing the features in cross-sectional shape of a single-crystal Si thin-film island region as formed on an insulating substrate. As shown in FIG. 6A, the cross-sectional shape of the single-crystal film island region thus formed in this embodiment is definable by the crystal cross-section's width (W), film thickness (H), curvature radius (R), and contact angle (θ) relative to the substrate. These parameters are determined depending upon the film thickness of a thin-film semiconductor on the insulating substrate, the patterning scheme used, the wettability with respect to an Si thin-film, the surface tension of an Si thin-film, the kind of laser, and the scanning method used. One example is that laser-scanning single-crystallization is performed by use of a specimen having an amorphous Si film which is 50 nm thick, thus obtaining a stripe-shaped single-crystal thin-film with W being equal to about 1.0 μm, H equal to about 100 nm, and θ of about 30°, while having a length of 100 μm, more or less. Note that these values are not the values limited to this embodiment, and it is also possible to obtain single-crystal thin-film island regions with further greater areas by modifying the film thickness of amorphous Si and the energy of laser irradiation and others in a variety of ways. Also note that adequately designing the materials of the wettability-different films and the patterning shapes makes it possible to form, on the insulating substrate, single-crystal film island regions with various cross-sectional shapes as shown in FIGS. 6B to 6D.

Figures 7A, 7B:
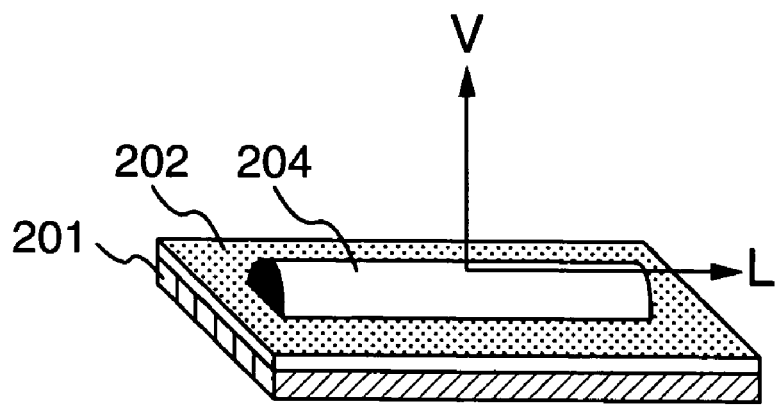
FIGS. 7A and 7B are diagrams showing the crystal surface orientation of a single-crystal Si thin-film formed on an insulating substrate.

Reference is now made to FIGS. 7A and 7B. FIG. 7A (upper part) is a diagram for explanation of the crystal plane/surface orientation obtained as a result of analysis using electron diffraction methods, in the stripe-shaped single-crystal Si thin-film thus formed in this embodiment. FIG. 7B shows a table indicating crystal orientations in a vertical direction with respect to respective crystal surfaces. Upon determination of the crystal surface orientations by means of electron diffraction methods, the direction of an incoming electron beam is substantially at right angles to the substrate. Additionally, although a need is felt to let the specimen of interest be inclined or tilted within an angular range of ±5° with respect to the electron beam's incident direction in order to obtain the optimal crystal surface orientation, such tilting within this angular range hardly affects the determination of the crystal surface orientation. The actual analysis results demonstrate that the crystal surface orientation in a vertical direction to the substrate (i.e., V-direction) is <110> at more than 90% of all measurement points, with the others exhibiting the presence of <100> and <111> or else at random. In short, this indicates that the main orientation of the single-crystal thin-film thus formed in this embodiment in the vertical direction relative to the substrate is <110>. Additionally, the surface direction in cross-section of the stripe-shaped single-crystal thin-film was analyzed by an electron diffraction method to reveal the fact that the surface orientation of a stripe shape in the laser scan direction, that is, in the elongate direction thereof (L-direction), is such that <100> is the main orientation. FIG. 7B shows the crystal orientation in the L-direction with respect to the crystal orientation in the V-direction, noting that the L-direction refers to the laser scanning direction. For example, when the V-direction is <100>, the L-direction at right angles thereto becomes the direction <100> or <110> or <111>.

As is apparent from the foregoing discussion, the use of the method for patterning the initial thin-film prior to single-crystallization by means of laser scanning makes it possible to form the intended island region of single-crystal Si thin-film at a specific location. It is also possible to further enhance the surface tension effects. Thus, it becomes possible to successfully form a single-crystal Si thin-film of high quality. It must be noted that although the patterning is applied to the amorphous Si thin-film in this embodiment, an alternative approach is available as another embodiment which follows. The amorphous Si thin-film is polycrystallized by an excimer laser or the like. Then, the resultant poly-Si thin film is patterned. Thereafter, the single-crystallization may be performed by using a solid-state laser or similar device. Optionally, the process of fabricating an amorphous Si thin-film on the insulating substrate as the initial Si thin-film prior to laser scanning may be replaced with a process of fabricating the poly-Si thin-film by using, for example, either a low-temperature CVD method using catalysts, also known as the catalytic CVD or "Cat-CVD" method, or a substrate heatup CVD method. Furthermore, it is also possible to perform laser-scanning single-crystallization after having patterned the poly-Si thin-film that was fabricated by these CVD methods.

Embodiment 3

This embodiment is an example which forms a thin-film semiconductor device at the single-crystal thin-film 204 which was formed by the manufacturing methods as has been explained in the above-noted embodiments 1 and 2. Its device structure and manufacturing method will be explained with reference to FIGS. 8A to 8E.

Figure 8A:
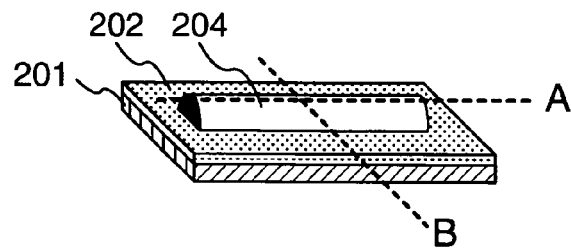
FIGS. 8A to 8E are diagrams each showing a thin-film semiconductor device using a single-crystal semiconductor thin-film formed on an insulating substrate.
Figure 8B:
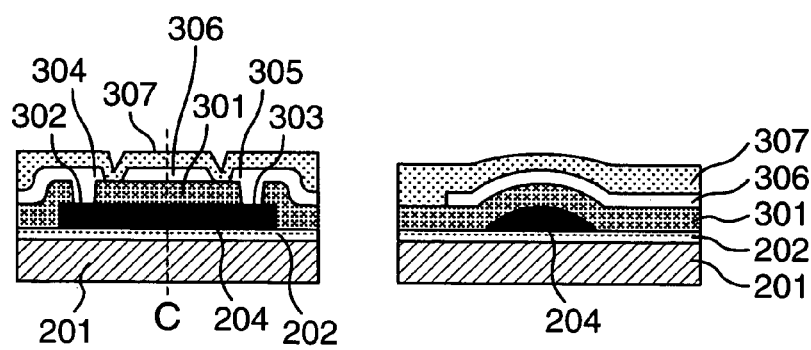

FIG. 8A depicts a stripe-shaped single-crystal Si thin-film 204 which is formed on an insulating substrate, wherein its elongate direction is indicated by dotted line A and its vertical direction is by dotted line B. FIG. 8B is a diagram for explanation of the cross-sectional structure of a MOS-TFT as formed at the stripe-shaped single-crystal Si thin-film shown in FIG. 8A, wherein the source/drain direction is identical to the elongate direction (direction A). A drawing on the left side shows a sectional structure as taken along the line A. A gate insulating film 301, also known as gate insulator film, is formed on the single-crystal Si film 204. Then, source/drain-use contact holes 302, 303 are formed along with electrodes 304–305, a gate electrode 306 and an insulating film 307. In addition, a cross-sectional structure taken along line C, which is depicted to pass through the center of the gate, is shown on the right side. A main feature lies in that the TFT's channel region is formed in the single-crystal Si film 204 with a cross-sectional shape resembling an ellipse.

Figure 8C:
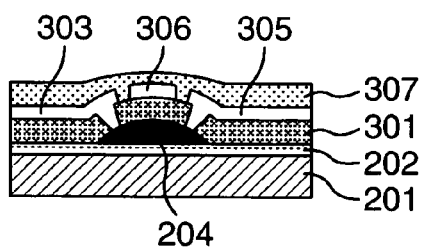

FIG. 8C is a drawing which shows a cross-sectional structure of a TFT with its source and drain disposed in a direction (direction B) which is perpendicular to the elongate direction of the stripe-shaped single-crystal film 204 shown in FIG. 8A. In this embodiment the gate electrode 306 is specifically laid out so that it extends in the elongate direction (direction A) of the stripe-like single-crystal Si thin-film 204. Thus, it becomes possible to increase the gate width, which in turn makes it possible to enhance the current driving capability of the TFT.

Figure 8D:
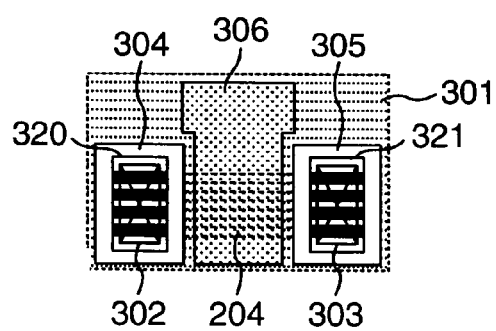

Additionally, FIG. 8D shows an exemplary TFT with its channel made up of a plurality of stripe-shaped single-crystal Si thin-films, each of which corresponds to the stripe-shaped single-crystal Si thin-film 204 stated supra. Although this TFT is arranged so that the contact holes of its source and drain are formed in each stripe-shaped single-crystal Si thin-film, it is also possible, as shown in the drawing, to process either a Si film being formed on the same surface of the single-crystal Si thin-film 204 or Si films, which are formed as separate layers, one of which overlies the single-crystal Si film 204 and the other of which underlies the same, in such a way that each has a rectangular shape. Contact holes 302 and 303 are then provided in the rectangular Si films 320 and 321. With such an arrangement, it was possible to suppress an unwanted cutaway of an underlay film of the single-crystal Si thin-film 204 which would otherwise occur due to over-etching at the time of opening of such contact holes. This in turn makes it possible to fabricate TFTs with increased stability and reliability. Additionally, although the case of a single gate is shown herein, it is also possible to employ a TFT structure having a plurality of gate electrodes.

It is also possible to form a TFT by micromachining the single-crystal film 204 using isotropic etch techniques prior to formation of the TFT to thereby change the cross-sectional shape into either a circle or ellipse.

Figure 8E:
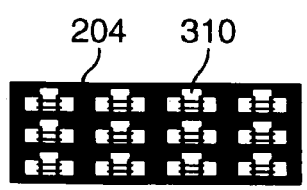

FIG. 8E is a diagram for explanation of an embodiment with a plurality of TFTs 310 formed on the single-crystal Si film 204 stated above. In this embodiment, a rectangular single-crystal Si thin-film 204 is formed so that its area measures about 5 µm×20 µm. Then, TFTs are formed by use of microfabrication techniques with the minimum feature size of more or less 0.1 µm. The layout of these TFTs and the source/drain direction or the like may be modified in a variety of ways when the need arises. In this way, it was possible to fabricate a plurality of thin-film semiconductor devices such as TFTs each formed of a single-crystal Si thin-film, thus enabling achievement of an integrated circuit.

As another embodiment, it was also possible to form TFTs by using laser scanning of single-crystallized island regions of an amorphous Si film as patterned, for example, into the shapes shown in FIGS. 4D–4E and then providing source/drain regions and gates in such single-crystal thin-film island regions.

In the way stated above, it was possible to realize the TFTs formed of a single-crystal Si thin-film on the insulating substrate by using a relatively simple and easy method with reduced process complexities. As these TFTs are high in performance and reliability and yet low in risk of variability in characteristics, it is possible by use of these TFTs to form large-scale integrated circuitry, formed on a conventional single-crystalline Si substrate, or on a quartz glass substrate which is an almost perfect insulating film substrate. Further, it is possible to form an image display apparatus with built-in circuitry on a large-area and low-cost glass substrate.

Although this embodiment is an example with formation of MOS-TFTs, it is also possible to form devices of different structures including, but not limited to, bipolar transistors and diodes other than the MOSTFTs, while taking full advantage of the film obtainable by the present invention, which is a single-crystal Si thin-film of high quality.

Embodiment 4

Figure 9A:
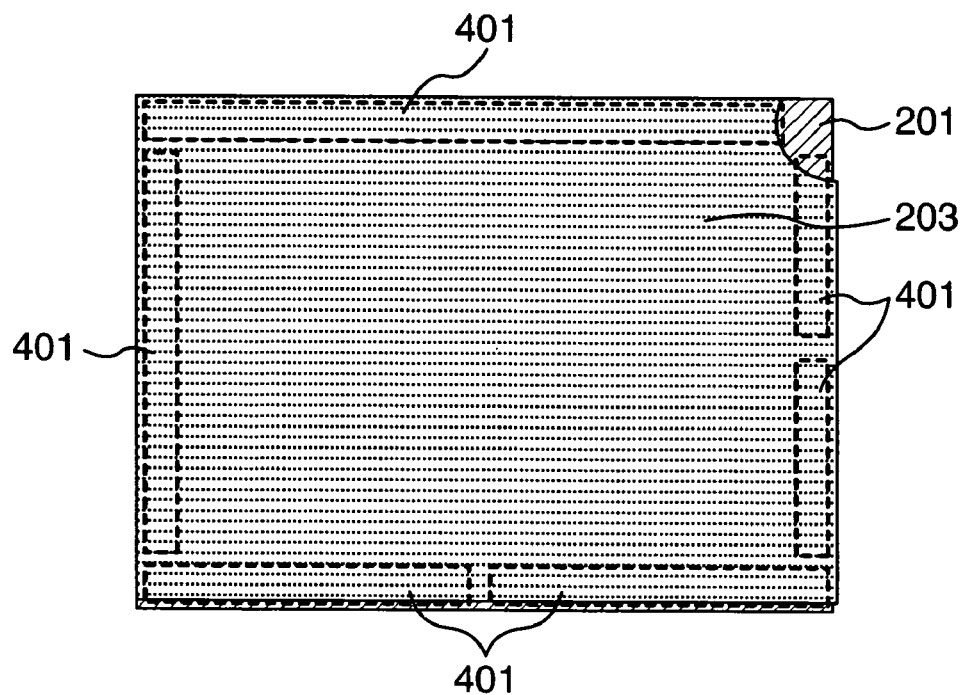
FIGS. 9A and 9B are plan views schematically showing an arrangement of an image display apparatus using a thin-film semiconductor device.

An explanation will next be given of an embodiment which employs, in an image display apparatus, thin-film semiconductor devices comprising the single-crystal Si thin-films shown in the above-discussed embodiments 1–3, with reference to schematic plan views of FIGS. 9A and 9B.

This embodiment is a so called system-on panel which mounts, on the same substrate, both an image display device made up of liquid crystal or organic electro-luminescence (EL) and its associative system components for driving it. These associative system components include, but are not limited to, a driver circuit, a digital-to-analog converter (DAC) circuit, a power supply circuit, a logic circuit, and a frame memory. These circuits are made up of TFTs incorporating the principles of this invention. In light of the fact that the TFTs are formed on the same glass substrate, the manufacturing process temperature was set at 500° C. or below, by way of example.

An explanation of the manufacturing process of such TFTs is as follows. First, as shown in FIG. 9A, an amorphous Si thin-film 203 is deposited on a large-size/low-cost insulating substrate 201 made, for example, of glass or plastic material. Then, an entire surface of the substrate is scanned by an excimer laser which is a first laser step to form a polycrystalline Si thin-film. Next, patterning is performed on the poly-Si thin-film, as required, for a region 401 at peripheral portions of a display pixel array in which necessary circuits are formed, such as a driver circuit, a digital-to-analog converter circuit, a power supply circuit, a logic circuit, a frame memory and others. Again, laser scanning, such as a solid-state laser, is applied thereto as a second laser step, thereby forming TFTs comprised of a single-crystal Si thin-film within the region 401 by the method of the invention and forming the necessary circuitry.

Although the above-noted crystallization process is designed to crystallize the entire substrate surface by an excimer laser and then single-crystallized for only the peripheral circuit region 401 by re-execution of the laser scanning, similar results are also obtainable by other methods. For instance, it is also possible to form the pixel built-in circuitry such as pixel TFTs and pixel memories or the like by a method having the steps of depositing an amorphous Si thin-film, single-crystallizing it by overall-surface laser scanning, forming TFTs comprised of a single-crystal Si thin-film not only in the peripheral circuit region but also in the display pixel array unit, and then forming the pixel built-in circuitry such as pixel TFTs and pixel memories. Optionally, in order to maximally eliminate laser scanning steps, the single-crystal Si thin-film TFTs may also be formed by depositing a poly-Si thin-film on the entire surface by low-temperature CVD methods, for example, and thereafter selectively laser-scanning only specified locations of the peripheral circuit region where the TFTs are to be formed.

Figure 9B:
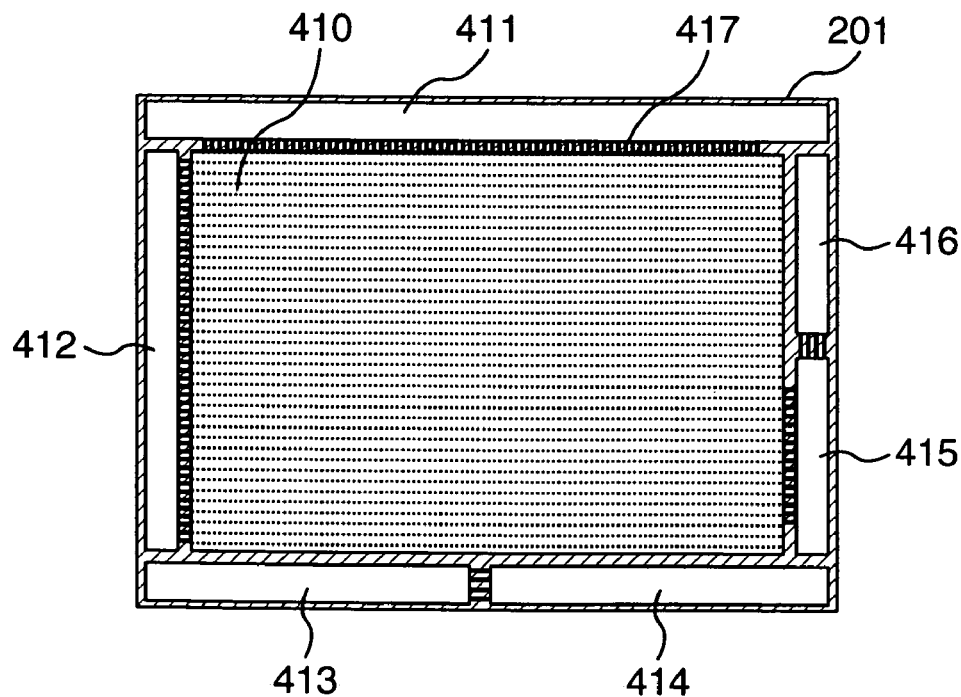

FIG. 9B is a schematic plan view of an apparatus configuration of a system-on panel using the TFTs as formed by the manufacturing process stated above. At the periphery of an image display unit 410, high-performance TFTs formed of a single-crystal Si thin-film are provided to thereby make up peripheral circuits such as circuitry 411 with a frame memory and an image/video signal driver included therein, a vertical scanning circuit 412, a logic circuit 413, an interface circuit 414, a power supply circuit 415, a DAC circuit 416 and others. Wiring leads 415 are used to connect between these peripheral circuits and pixel circuits, thus completing the system-on panel. Implementation of the invention enabled achievement of light weight and slim size of system-on panels high in picture image quality and reliability and yet low in power consumption.

Embodiment 5

This embodiment is electronic equipment employing the system-on panel shown in the above embodiment 4. Some preferred forms of it are shown in FIGS. 10A to 10D. Applicability is attained to various types of electronic equipment including, but not limited to, slim size of large-screen television (TV) sets, monitor units for use with personal computers (PCs), handheld wireless telephone handsets, and mobile information terminals such as personal digital assistant (PDA) tools. Very importantly, letting the peripheral circuits that have been arranged by LSI chip mount schemes be built together on the same substrate while using the TFTs of the invention makes it possible to reduce production costs in addition to the features such as high image quality, low power consumption, high reliability, reduced panel thickness, and light weight.

According to the present invention, it becomes possible to fabricate at low temperatures the thin-film semiconductor devices such as TFTs formed of a single-crystal Si thin-film on an insulating substrate. This, in turn, makes it possible to realize image display apparatus with built-in systems (e.g. system-on panels) and also achieve integrated circuitry on an almost complete insulating substrate.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A manufacturing method of a thin-film semiconductor device, said method comprising:
    a first step of forming a semiconductor thin-film above an insulating substrate and performing patterning of the semiconductor thin-film;
    a second step of patterning a plurality of materials different in surface tension and disposing resulting patterned materials at an upper part or a lower part of the semiconductor thin-film;
    a third step of melting the semiconductor thin-film by irradiating a laser beam onto the semiconductor thin-film and utilizing cohesion phenomena due to surface tension to perform position control in such a way as to perform positional alignment with a patterned position to thereby form an island region of an isolated single-crystal thin-film above said insulating substrate; and
    a fourth step of forming more than one active region of a thin-film transistor in the island region of the isolated single-crystal thin-film.

2. The manufacturing method of a thin-film semiconductor device according to claim 1, wherein said island region of the single-crystal thin-film has a cross-section perpendicular to the substrate, the cross-section being comprised of a substantially circular shape, a substantially elliptical shape or part of these shapes.

3. The manufacturing method of a thin-film semiconductor device according to claim 1, wherein said island region of the single-crystal thin-film is a stripe-shaped single-crystal thin-film and wherein an active region of a thin-film transistor is formed in the island region of the single-crystal thin-film.

4. The manufacturing method of a thin-film semiconductor device according to claim 3, wherein a source/drain direction of said thin-film transistor is disposed substantially parallel with or substantially perpendicular to an elongate direction of said stripe-shaped single-crystal thin-film.

5. The manufacturing method of a thin-film semiconductor device according to claim 3, wherein at least one film corresponding to said stripe-shaped single-crystal thin-film is included within the active region of said thin-film transistor.

6. The manufacturing method of a thin-film semiconductor device according to claim 3, wherein at least more than one region corresponding to the active region of said thin-film transistor is formed in said stripe-shaped single-crystal thin-film.

7. The manufacturing method of a thin-film semiconductor device according to claim 1, wherein a main crystal orientation of said island region of the single-crystal thin-film provided above said insulating substrate in a vertical direction relative to the substrate is <110>, <100> or <111>, and wherein a crystal orientation being in a horizontal direction with respect to the substrate and being an elongate direction of said island region of the single-crystal thin-film is <110>, <100> or <111>.

* * * * *